(12) United States Patent
Bang et al.

(10) Patent No.: US 11,104,985 B2
(45) Date of Patent: Aug. 31, 2021

(54) ULTRA-FINE PATTERN DEPOSITION APPARATUS, ULTRA-FINE PATTERN DEPOSITION METHOD USING THE SAME, AND LIGHT-EMITTING DISPLAY DEVICE MANUFACTURED BY ULTRA-FINE PATTERN DEPOSITION METHOD

(71) Applicant: LG Display Co., Ltd., Seoul (KR)

(72) Inventors: Hyungseok Bang, Daegu (KR); Joonghwan Yang, Daegu (KR); Dongwook Choi, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/173,472

(22) Filed: Oct. 29, 2018

(65) Prior Publication Data

US 2019/0127839 A1     May 2, 2019

(30) Foreign Application Priority Data

Oct. 31, 2017   (KR) .......................... 10-2017-0144249

(51) Int. Cl.
*C23C 14/04* (2006.01)
*C23C 14/24* (2006.01)
*H01L 27/32* (2006.01)
*H01L 51/00* (2006.01)

(52) U.S. Cl.
CPC ............ *C23C 14/042* (2013.01); *C23C 14/24* (2013.01); *H01L 27/3211* (2013.01); *H01L 51/0011* (2013.01)

(58) Field of Classification Search
CPC ..................................................... C23C 14/24
See application file for complete search history.

(56) References Cited

U.S. PATENT DOCUMENTS 6,255,775 B1    7/2001  Ikuko et al.
2007/0266943 A1  11/2007  Yeh et al.
(Continued)

FOREIGN PATENT DOCUMENTS

CN    103014630 A    4/2013
CN    105132868 A    12/2015
(Continued)

*Primary Examiner* — Keath T Chen
(74) *Attorney, Agent, or Firm* — Seed IP Law Group LLP

(57) ABSTRACT

A deposition apparatus, such as an ultra-fine pattern deposition apparatus is provided. A deposition apparatus includes a base substrate, a heating assembly, a deposition source material and a pattern guide. The heating assembly has at least a part thereof included in the base substrate. The deposition source material is disposed on the heating assembly. The pattern guide overlies the base substrate and has a portion thereof above the heating assembly and the deposition source material. The pattern guide has an opening including a laterally recessed lower region and an upper region. The opening extends from an upper surface of the base substrate to an upper surface of the pattern guide. The lower region of the opening is wider than the upper region of the opening, and the opening of the pattern guide is configured to guide a material emitted from the deposition source material to a target region on a target substrate that is spaced apart from the base substrate.

13 Claims, 10 Drawing Sheets

(56) References Cited

U.S. PATENT DOCUMENTS

| | | |
|---|---|---|
| 2008/0160661 A1* | 7/2008 | Henley .............. H01L 31/18 |
| | | 438/68 |
| 2009/0203285 A1* | 8/2009 | Kobayashi ......... H01L 27/3211 |
| | | 445/58 |
| 2009/0232976 A1 | 9/2009 | Yoon et al. |
| 2009/0325451 A1 | 12/2009 | Higo et al. |
| 2010/0015424 A1 | 1/2010 | Seo et al. |
| 2011/0052791 A1 | 3/2011 | Jo et al. |
| 2011/0151153 A1* | 6/2011 | Felder ................. C08L 65/00 |
| | | 428/32.86 |
| 2012/0231228 A1 | 9/2012 | Fujimori et al. |
| 2013/0068160 A1 | 3/2013 | Wang et al. |
| 2013/0133573 A1 | 5/2013 | Joo et al. |
| 2013/0240870 A1 | 9/2013 | Kawato et al. |
| 2014/0008456 A1 | 1/2014 | Lee |
| 2014/0315134 A1* | 10/2014 | Bang ................... G03F 7/0035 |
| | | 430/324 |
| 2016/0111681 A1* | 4/2016 | Kim ................... H01L 51/0011 |
| | | 438/26 |

FOREIGN PATENT DOCUMENTS

| | | |
|---|---|---|
| CN | 105529408 A | 4/2016 |
| CN | 106521411 A | 3/2017 |
| GB | 2570029 A | 7/2019 |
| JP | 2000-133443 A | 5/2000 |
| JP | 2001-295027 A | 10/2001 |
| JP | 2002-302759 A | 10/2002 |
| JP | 2007-154253 A | 6/2007 |
| JP | 2010-50087 A | 3/2010 |
| JP | 2010-199095 A | 9/2010 |
| JP | 2013-235879 A | 11/2013 |
| KR | 10-2008-0067951 A | 7/2008 |
| KR | 10-2012-0113747 A | 10/2012 |
| KR | 10-2014-0004916 A | 1/2014 |
| KR | 10-2016-0033091 A | 3/2016 |
| KR | 10-2016-0078627 A | 7/2016 |
| KR | 10-2017-0049767 A | 5/2017 |
| WO | 2011/122018 A1 | 10/2011 |

* cited by examiner

ULTRA-FINE PATTERN DEPOSITION APPARATUS, ULTRA-FINE PATTERN DEPOSITION METHOD USING THE SAME, AND LIGHT-EMITTING DISPLAY DEVICE MANUFACTURED BY ULTRA-FINE PATTERN DEPOSITION METHOD

CROSS-REFERENCE TO RELATED APPLICATION(S)

This application claims the benefit of Korean Patent Application No. 10-2017-0144249, filed on Oct. 31, 2017, which is incorporated herein by reference for all purposes as if fully set forth herein.

BACKGROUND

Technical Field

The present disclosure relates to an ultra-fine pattern deposition apparatus, an ultra-fine pattern deposition method using the same, and a light-emitting display device manufactured by the ultra-fine pattern deposition method.

Description of the Related Art

With the development of information technology, markets for display devices which are connection media between users and information are growing. Accordingly, various types of display devices such as organic light-emitting displays, liquid crystal displays, electrophoretic displays and quantum dot displays are increasingly used.

A structure in the form of a thin film is formed by a deposition apparatus. Conventional pattern deposition apparatuses are based on a fine metal mask. However, conventional pattern deposition apparatuses increase a pattern dimension allowance due to considerable deviation in mask shadowing (blocking a source to be deposited on a substrate due to the structure of an opening of a mask). Furthermore, the conventional pattern deposition apparatuses have problems regarding sagging of the center of a mask and accuracy reduction according thereto and thus cannot deposit an ultra-fine (ultra-fine pitch) pattern. Therefore, there is a demand for a deposition apparatus for realizing an ultra-fine (ultra-fine pitch) pattern to achieve a large-size display panel.

BRIEF SUMMARY

In an embodiment, the present disclosure provides a deposition apparatus including a base substrate, a heating assembly, a deposition source material, and a pattern guide. The heating assembly is has at least a part thereof included in the base substrate. The deposition source material is disposed on the heating assembly. The pattern guide overlies the base substrate and has a portion thereof above the heating assembly and the deposition source material. The pattern guide has an opening including a laterally recessed lower region and an upper region. The opening extends from an upper surface of the base substrate to an upper surface of the pattern guide. The lower region of the opening is wider than the upper region of the opening, and the opening of the pattern guide is configured to guide a material emitted from the deposition source material to a target region on a target substrate that is spaced apart from the base substrate.

In another embodiment, the present disclosure provides a deposition method using a deposition apparatus including a plurality of heating assemblies at least partially included in a base substrate, a deposition source material disposed on the heating assemblies, and a pattern guide on the substrate and having a plurality of openings, each of the openings including a laterally recessed lower region and an upper region, the openings extending from an upper surface of the base substrate to an upper surface of the pattern guide, the lower region of the openings being wider than the upper region of the openings. The method includes: arranging the deposition apparatus to face a target substrate; aligning the openings of the deposition apparatus with target regions of the target substrate; and depositing a material on the target regions of the target substrate by supplying a voltage to the heating assemblies and emitting the material through the openings.

In another embodiment, the present disclosure provides a light-emitting display device manufactured by the deposition method.

BRIEF DESCRIPTION OF THE SEVERAL VIEWS OF THE DRAWINGS

The accompany drawings, which are included to provide a further understanding of the disclosure and are incorporated on and constitute a part of this specification illustrate embodiments of the disclosure and together with the description serve to explain the principles of the disclosure.

DETAILED DESCRIPTION

Reference will now be made in detail embodiments of the disclosure examples of which are illustrated in the accompanying drawings.

Hereinafter, specific embodiments of the present disclosure will be described with reference to the attached drawings.

An ultra-fine (ultra-fine pitch) pattern deposition apparatus which will be described below can be used to manufacture a display panel of a display device for use in TV, video players, personal computers (PCs), home theaters, smartphones, virtual reality (VR) devices, etc. Although display panels are provided as an example structure that can be manufactured using the ultra-fine pattern deposition apparatuses and methods provided herein, it will be readily appreciated that the ultra-fine pattern deposition apparatuses and methods provided herein may be utilized to manufacture other structures.

The aforementioned display devices may be organic light-emitting displays, liquid crystal displays, electrophoretic displays and quantum dot displays. Display devices include a display panel, a driver which drives the display panel and a controller which controls the driver. There are various types of display panels used for display devices.

However, display devices are similar in that a substrate and a structure formed as a thin film on the substrate are used to form the display panel. Accordingly, any display device which utilizes a method of depositing a thin film, particularly, an organic thin film (organic layer) on a substrate can be manufactured through the ultra-fine pattern deposition apparatus described in the present disclosure and the present disclosure is not limited to the aforementioned display devices.

In addition, organic thin films may include a hole transport layer (HTL), a hole injection layer (HIL), an emitting layer (EML), an electron transport layer (ETL), an electron injection layer (EIL), a capping layer (CPL), a charge generated layer (CGL), an electron blocking layer (EBL), an efficiency enhanced layer (EEL), an RGB prime layer, etc.

RELATED ART

Figure 1:
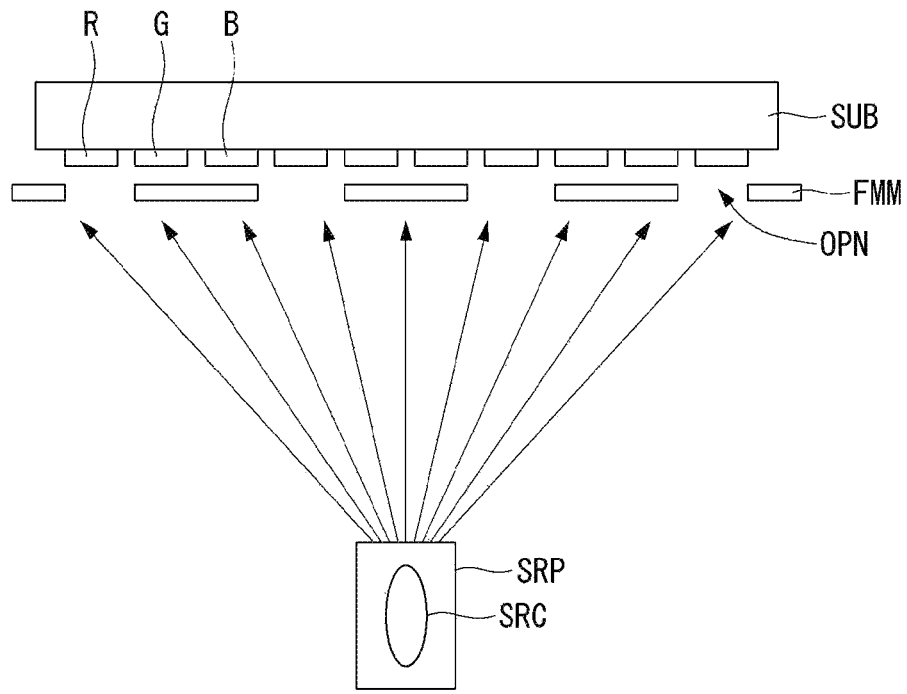
FIG. 1 is a diagram schematically illustrating a conventional pattern deposition apparatus.

FIG. 1 is a diagram schematically illustrating a conventional pattern deposition apparatus.

As shown in FIG. 1, the conventional pattern deposition apparatus is based on a fine metal mask (FMM) (referred to as a mask hereinafter). The mask FMM has openings OPN for depositing an organic source SRC emitted from a source storage unit SRP on only a specific region on a substrate SUB.

For example, if green sub-pixels G and blue sub-pixels B have been formed, as shown, the openings OPN of the mask FMM expose only regions corresponding to red sub-pixels R.

However, the conventional pattern deposition apparatus increases a pattern dimension allowance due to considerable deviation in mask shadowing (blocking a source to be deposited on a substrate due to the structure of an opening of a mask).

Furthermore, the conventional pattern deposition apparatus has problems regarding sagging of the center of the mask FMM (sagging of the center due to increase in the mask weight or gravity) and accuracy reduction caused thereby and thus cannot deposit an ultra-fine pattern. Therefore, a deposition apparatus different from the conventional pattern deposition apparatus is needed in order to achieve a large-size display panel.

First Embodiment

Figure 2:
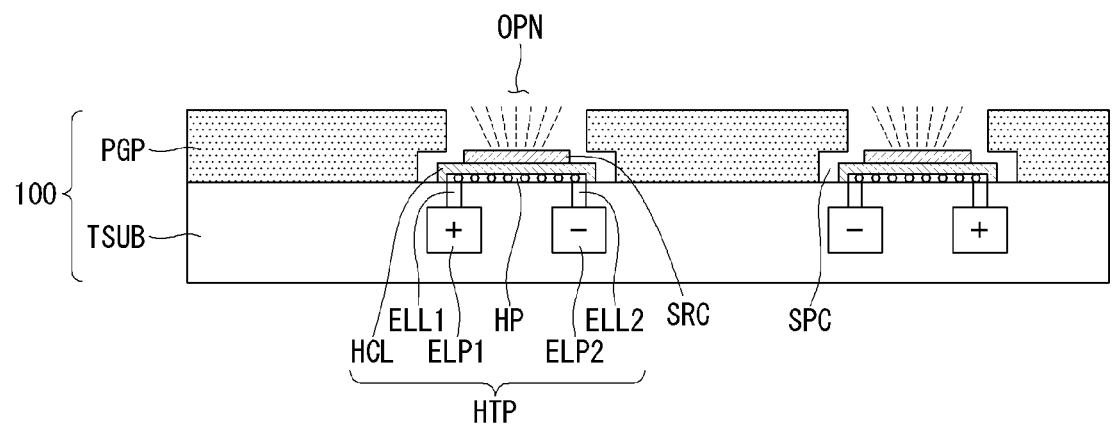
FIG. 2 is a diagram illustrating an ultra-fine pattern deposition apparatus according to a first embodiment of the present disclosure.
Figure 3:
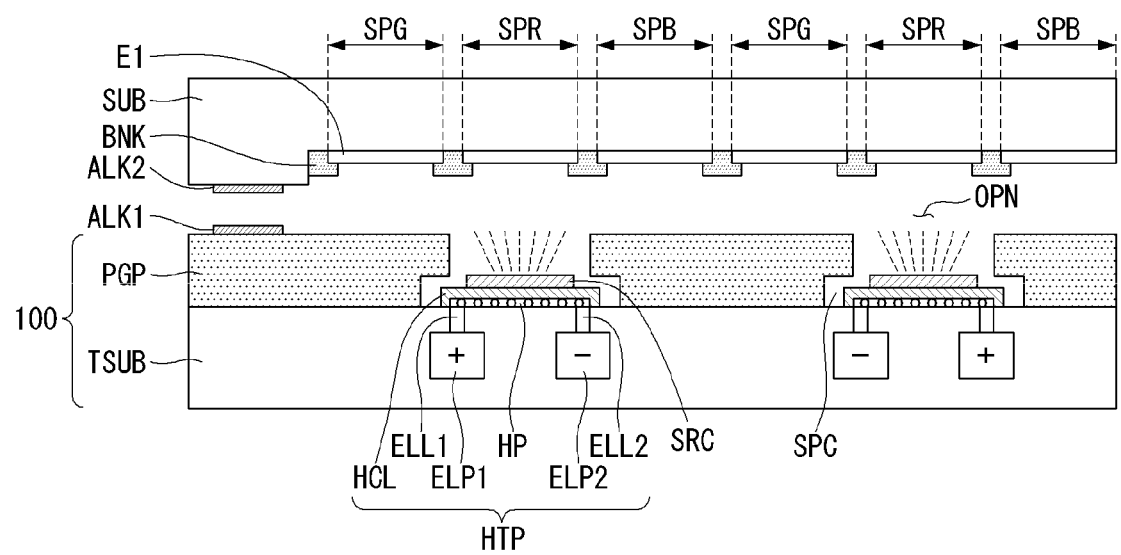
FIG. 3 is a schematic diagram for describing pattern deposition using the ultra-fine pattern deposition apparatus shown in FIG. 2.
Figure 4:
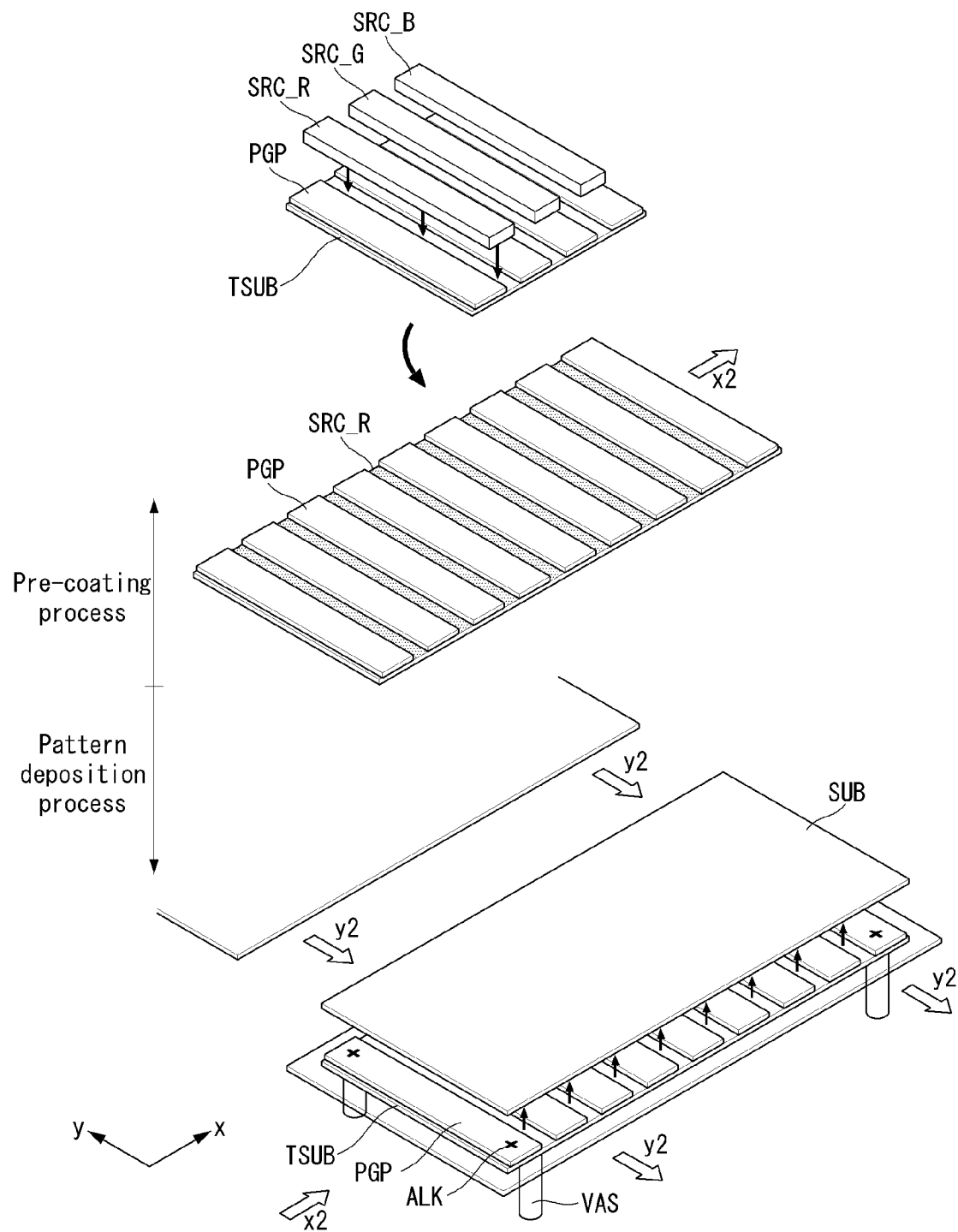
FIG. 4 illustrates a process flow for describing processes from source pre-coating to pattern deposition.

FIG. 2 is a diagram illustrating an ultra-fine pattern deposition apparatus according to a first embodiment of the present disclosure, FIG. 3 is a schematic diagram for describing pattern deposition using the ultra-fine pattern deposition apparatus and FIG. 4 illustrates a process flow for describing processes from source pre-coating to pattern deposition.

As shown in FIG. 2, the ultra-fine pattern deposition apparatus 100 according to the first embodiment of the present disclosure includes a base substrate TSUB, a heating assembly HTP (which may be referred to herein as heating part HTP), a pattern guide PGP and a deposition source material SRC (which may be referred to herein as source part SRC).

The base substrate TSUB serves as a base of the ultra-fine pattern deposition apparatus 100. The substrate TSUB is formed of a transparent material. For example, the base substrate TSUB may be formed of any transparent material having high transparency (transmittance), such as quartz or amorphous glass. However, the present disclosure is not limited thereto.

A source which evaporates in response to external heat applied thereto may be selected for the source part SRC. For example, an organic source or an inorganic source may be selected for the source part SRC. An organic source and an inorganic source will be collectively called a source hereinafter.

The heating part HTP serves to apply heat to the source part SRC. The heating part HTP is disposed on one side of the base substrate TSUB or inside of the base substrate TSUB, or separated and disposed on one side and inside of the base substrate TSUB. That is, one or more components of the heating assembly HTP may be disposed on the base substrate TSUB, while one or more other components of the heating assembly HTP may be disposed within the base substrate TSUB. The heating part HTP is formed in a structure which generates heat capable of evaporating the source (e.g., a deposition material) contained in the source part SRC. For example, the heating part HTP includes a heater HP, a thermal conductive layer HCL, electric line layers ELL1 and ELL2, and electrode layers ELP1 and ELP2.

The electrode layers ELP1 and ELP2 are electrodes to which a positive voltage (+) and a negative voltage (−) are applied. The electric line layers ELL1 and ELL2 are electric lines for transferring the positive voltage (+) and the negative voltage (−) applied through the electrode layers ELP1 and ELP2 to the heater HP. The heater HP may be a resistor (or any other heating element) which generates heat in response to the positive voltage (+) and the negative voltage (−). The thermal conductive layer HCL is a conductor which uniformly transfers the heat generated from the heater HP to the source part SRC.

The pattern guide PGP serves to guide the source emitted from the source part SRC to a target region while preventing the source from arriving at regions other than the target region. The pattern guide PGP is formed on one side of the base substrate TSUB. The upper part of the pattern guide PGP is higher than the upper parts of the heater HP and the source part SRC. That is, the pattern guide PGP has an upper surface that is spaced apart from a surface of the base substrate TSUB by a greater distance than are the upper surfaces of the heater HP and the source part SRC. The heater HP and the source part SRC are disposed inside of openings OPN of the pattern guide PGP.

The pattern guide PGP includes the openings OPN having a laterally recessed lower region (which may be referred to herein as a lower part) and an upper region (which may be referred to herein as an upper part) protruded from the lower part in order to guide the source emitted from the source part SRC to a target region. The openings OPN extend from an upper surface of the base substrate TSUB to an upper surface of the pattern guide PGP. The lower region of the openings OPN is wider than the upper region of the openings, and the openings OPN permit egress of (and guide) a deposition material emitted from the source part SRC to a target region of a target substrate that is spaced apart from the base substrate TSUB. As a result, the openings OPN expose only the source part SRC when viewed from above the base substrate TSUB. For reference, the lower parts of the openings OPN contact the base substrate TSUB and the upper parts thereof are exposed to outside. Accordingly, the pattern guide PGP may have a T-shape (or a mushroom shape). However, the shape of the pattern guide PGP is not limited to that shown in the figure. A non-opening parts of the pattern guide PGP may be defined as a region in which the source is not emitted, that is, a non-deposition region, and the opening OPN corresponding to the source part SRC may be defined as a region through which the source is emitted, that is, a deposition region.

The opening OPN of the pattern guide PGP and the source part SRC may have identical or similar sizes and shapes. For example, from a top view, the opening OPN and the source part SRC may have sizes and/or shapes that correspond with one another. The source emitted from the source part SRC forms emission regions of sub-pixels. The opening OPN of the pattern guide PGP and the source part SRC may be formed in a triangular, rectangular, square, circular, oval, diamond or polygonal shape. However, the present disclosure is not limited thereto.

In addition, the width of the opening OPN corresponds to the width of the emission region of a sub-pixel arranged facing the opening OPN. For example, when a sub-pixel emitting light in a first color is disposed at the left, right or top of a sub-pixel emitting light in the same first color, the opening OPN has a width corresponding to the emission regions of the two sub-pixels. Further, the opening OPN may have different widths according to positions. For example, sub-pixels may have different emission region widths and thus the opening OPN may have different widths corresponding thereto.

As shown in FIG. 3, the ultra-fine pattern deposition apparatus 100 according to the first embodiment is arranged under a target substrate SUB on which the source will be deposited.

The target substrate SUB includes green sub-pixel regions SPG, red sub-pixel regions SPR and blue sub-pixel regions SPB. The target substrate SUB may further include white sub-pixel regions (not shown). The green sub-pixel regions SPG, red sub-pixel regions SPR and blue sub-pixel regions SPB are isolated from one another by a bank layer BNK. Lower electrodes (or anode electrodes) E1 are formed on the green sub-pixel regions SPG, red sub-pixel regions SPR and blue sub-pixel regions SPB and exposed. That is, the bank layer BNK serves to define the emission regions of the sub-pixels SPG, SPR and SPB by selectively exposing the lower electrodes E1.

Alignment marks ALK1 and ALK2 are respectively formed on the surfaces of the ultra-fine pattern deposition apparatus 100 and the target substrate SUB, which face each other. The ultra-fine pattern deposition apparatus 100 and the target substrate SUB are arranged and aligned on the basis of the alignment marks ALK1 and ALK2.

The alignment marks ALK1 and ALK2 are used to arrange and align the ultra-fine pattern deposition apparatus 100 and the target substrate SUB such that the source is correctly deposited on a target region. The ultra-fine pattern deposition apparatus 100 and the target substrate SUB may be aligned with each other such that structures corresponding to top layers thereof contact each other or almost contact each other, or they are separated by a predetermined distance or longer.

When the ultra-fine pattern deposition apparatus 100 and the target substrate SUB have been aligned, the openings OPN of the pattern guide PGP correspond to the emission regions of selected sub-pixels, as can be seen from the cross section of the aligned ultra-fine pattern deposition apparatus 100 and the target substrate SUB. As shown, when the ultra-fine pattern deposition apparatus 100 is configured to deposit an organic thin film of the red sub-pixels, for example, the openings OPN of the pattern guide PGP correspond to only the emission regions of the red sub-pixel regions SPR. As shown in FIG. 3, the openings OPN may have a somewhat greater width than the width of the corresponding emission regions of the red sub-pixel regions SPR; however, the openings OPN correspond only with the emission regions of the red sub-pixel regions SPR (e.g., the openings OPN do not correspond with the blue or green sub-pixel regions SPB, SPG).

As shown, when alignment between the ultra-fine pattern deposition apparatus 100 and the target substrate SUB is completed, the heating part HTP generates heat and thus the source or deposition material of the source part SRC evaporates and is guided by the pattern guide PGP to be deposited on target regions of the target substrate SUB. For example, when a red organic source is selected for the source part SRC of the ultra-fine pattern deposition apparatus 100 shown in FIG. 3, the ultra-fine pattern deposition apparatus 100 can be defined as an ultra-fine pattern deposition apparatus for depositing a red organic source.

The ultra-fine pattern deposition apparatus 100 may be classified into an apparatus for depositing a red organic source, an apparatus for depositing a green organic source and an apparatus for depositing a blue organic source. In this case, sources may be pre-coated by colors thereof and then pattern deposition may be performed. This will be described below. In the following, the ultra-fine pattern deposition apparatus for depositing a red organic source will be described as an example.

As shown in FIG. 4, a red organic source SRC_R is coated in the openings OPN of the pattern guide PGP formed on the base substrate of the ultra-fine pattern deposition apparatus 100 for depositing a red organic source. For example, the red organic source SRC_R is filled in all openings OPN while the ultra-fine pattern deposition apparatus for depositing a red organic source is transferred by a transfer means such as a conveyor belt in an x2 direction in the X-axis direction.

The ultra-fine pattern deposition apparatus is used in a source pre-coating process. Although the ultra-fine pattern deposition apparatus 100 is an ultra-fine pattern deposition apparatus for depositing a red organic source when the red organic source SRC_R is coated, as described above, the ultra-fine pattern deposition apparatus 100 is an ultra-fine pattern deposition apparatus for depositing a green organic source when the green organic source SRC_G is coated and an ultra-fine pattern deposition apparatus for depositing a blue organic source when the blue organic source SRC_B is coated.

Thereafter, the ultra-fine pattern deposition apparatus 100 for depositing a red organic source and the target substrate SUB are arranged and aligned on the basis of the alignment keys ALK provided thereto and a vision system VAS, which may be or include a camera and associated processing circuitry capable of perceiving the alignment keys ALK. Then, a voltage is applied to the ultra-fine pattern deposition apparatus 100 for depositing a red organic source for ultra-fine pattern deposition to cause the heating part to generate heat, and a pattern deposition process through which the source evaporates is performed. The source deposited on the red sub-pixel regions of the target substrate SUB becomes an organic thin film for emitting red light. Upon completion of a process of forming an upper electrode (or cathode electrode), the organic thin film becomes an organic emitting layer emitting light on the target substrate SUB.

The pattern deposition process for depositing the red organic thin film can be performed while the target substrate SUB is moved in a y2 direction in the Y-axis direction although the ultra-fine pattern deposition apparatus for depositing a red organic source is moved in the x2 direction. However, the apparatus for performing the pattern deposition process and the substrate movement directions are exemplary and the present disclosure is not limited thereto.

Second Embodiment

Figure 5:
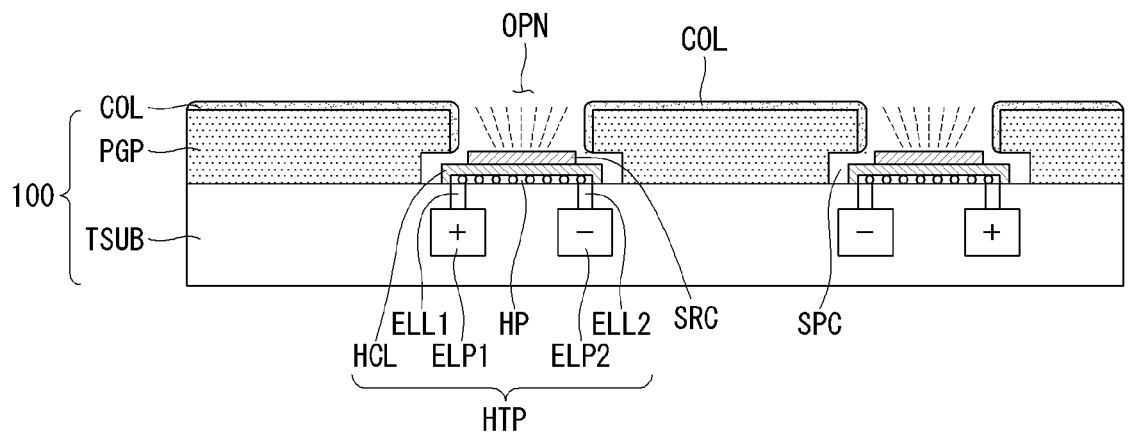
FIG. 5 is a diagram illustrating an ultra-fine pattern deposition apparatus according to a second embodiment of the present disclosure.

FIG. 5 is a diagram illustrating an ultra-fine pattern deposition apparatus according to a second embodiment of the present disclosure.

As shown, the configuration of the ultra-fine pattern deposition apparatus 100 according to the second embodiment of the present disclosure is similar to the ultra-fine pattern deposition apparatus 100 according to the first embodiment, but the second embodiment differs from the first embodiment in that a coating layer COL is additionally formed on the pattern guide PGP.

The coating layer COL serves to prevent the source from being coated on the pattern guide PGP during the source pre-coating process or to aid in simultaneous removal of the coating layer COL and the source coated thereon through a simple cleaning process. The coating layer COL may be formed to cover the surface and side of the pattern guide PGP.

The structure in which the coating layer COL is formed on the pattern guide PGP does not require a selective coating process for depositing a source in a specific color in the opening OPN of the pattern guide PGP formed on the base substrate TSUB.

That is, when the coating layer COL is present, source pre-coating can be performed from the front of the ultra-fine pattern deposition apparatus 100. In addition, when the coating layer COL is present, a problem caused by a source remaining in the region (on the surface of the pattern guide) other than the opening OPN of the pattern guide PGP can be solved (because residue generated in the selective coating process can be removed).

Third Embodiment

Figure 6:
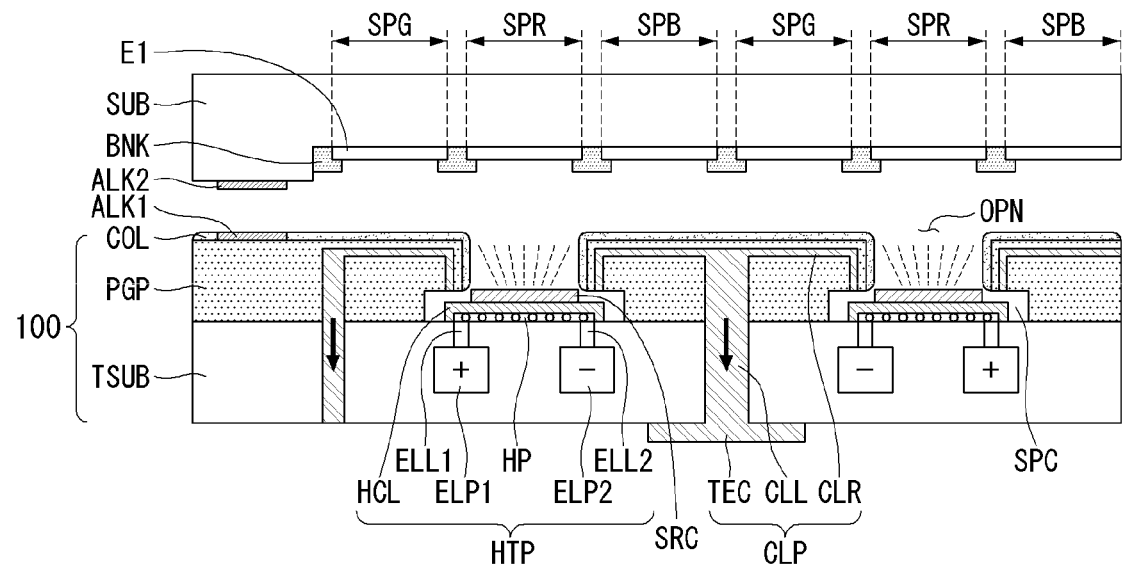
FIG. 6 is a diagram illustrating an ultra-fine pattern deposition apparatus according to a third embodiment of the present disclosure and a target substrate.

FIG. 6 is a diagram illustrating an ultra-fine pattern deposition apparatus according to a third embodiment of the present disclosure and a target substrate.

As shown in FIG. 6, the configuration of the ultra-fine pattern deposition apparatus 100 according to the third embodiment of the present disclosure is similar to that of the ultra-fine pattern deposition apparatus according to the first or second embodiment, but the third embodiment differs from the first or second embodiment in that a cooler CLP (which may be referred to herein as cooling part CLP) is additionally formed.

The cooling part CLP serves to reduce the heat transferred to the pattern guide PGP such that heat generated from the heating part HTP is not transferred to the non-deposition region or to maintain the pattern guide PGP at a temperature lower than the heater HP. The cooling part CLP is implemented as a manual type formed of a material which controls heat (e.g., a passive heat sink) or an active type with electrical control for controlling heat.

In the following, an example in which the cooling part CLP is implemented as the active type will be described. The cooling part CLP includes a cooling layer CLR, a connecting layer CLL and a thermoelectricity controller TEC.

The cooling layer CLR may be disposed inside of the pattern guide PGP when the coating layer COL is not present and may be disposed under the coating layer COL when the coating layer COL is present (as shown in FIG. 6). The connecting layer CLL may be formed to penetrate the pattern guide PGP to the other side of the base substrate TSUB. That is, the connecting layer CLL may extend completely through the pattern guide PGP and completely through the base substrate TSUB. The thermoelectricity controller TEC may be disposed on the other side, e.g., a rear side, of the base substrate TSUB.

The cooling layer CLR serves to cool the pattern guide PGP or to maintain the pattern guide PGP at a temperature lower than the heater HP. The connecting layer CLL serves to electrically or mechanically connect the cooling layer CLR with the thermoelectricity controller TEC.

The thermoelectricity controller TEC serves to control heat such that the temperature of the pattern guide PGP can be controlled using the cooling layer CLR. For example, the thermoelectricity controller TEC may be realized as a "thermoelectric cooler" which can absorb heat through the cooling layer CLR by controlling a current flow direction. However, the present disclosure is not limited thereto.

A structure in which the cooling layer CLR is formed aids in screening a region in which the source need not be deposited and thus can improve pattern accuracy. In addition, the cooling part can prevent a source remaining on the pattern guide PGP from being deposited on the bank layer BNK of the target substrate SUB in a structure in which the coating layer COL is not present.

Fourth Embodiment

Figure 7:
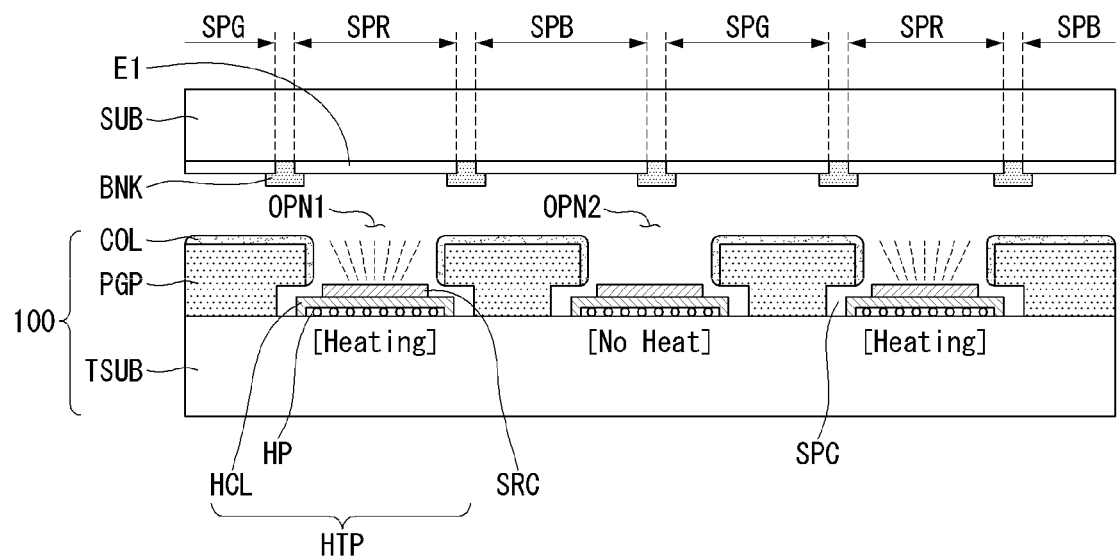
FIGS. 7 and 8 are diagrams for describing a method for improving source usage efficiency when a pattern is deposited using an ultra-fine pattern deposition apparatus according to a fourth embodiment of the present disclosure.
Figure 8:
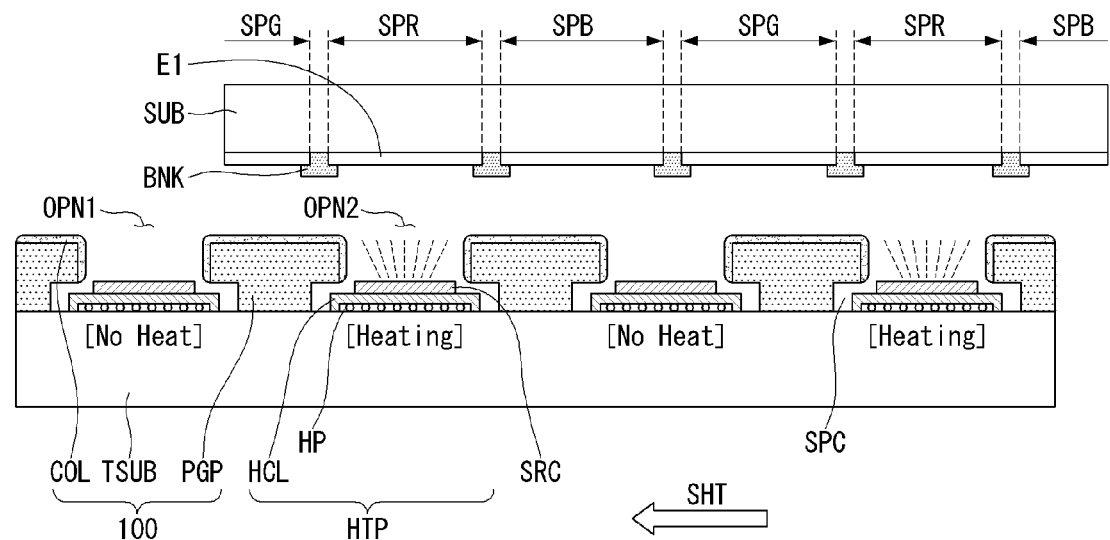

FIGS. 7 and 8 are diagrams for describing a method for improving source usage efficiency when a pattern is deposited using an ultra-fine pattern deposition apparatus according to a fourth embodiment of the present disclosure.

As shown in FIGS. 7 and 8, the ultra-fine pattern deposition apparatus 100 according to the fourth embodiment of the present disclosure may be based on one of the first to third embodiments. The fourth embodiment is related to improvement of source usage efficiency of the ultra-fine pattern deposition apparatus. This will be described below.

The pattern guide PGP includes first openings OPN1 and second openings OPN2. Source parts SRC formed of the same material (in the same color) are disposed in the first openings OPN1 and the second openings OPN2.

The source part SRC formed in the first openings OPN1 emits the source according to heating of the heating part HTP during primary pattern deposition shown in FIG. 7. As a result, the source emitted through the first openings OPN1 is deposited on a target substrate SUB. Here, the heating part HTP corresponding to the second openings OPN2 maintains in a state in which it does not generate heat.

The source part SRC formed in the second openings OPN2 emits the source according to heating of the heating part HTP during secondary pattern deposition shown in FIG. 8. As a result, the source emitted through the second openings OPN2 is deposited on the target substrate SUB. Here, the heating part HTP corresponding to the first openings OPN1 maintains in a state in which it does not generate heat.

To deposit the source through the method shown in FIGS. 7 and 8, the ultra-fine pattern deposition apparatus 100 may be shifted to the left as shown. Here, the ultra-fine pattern deposition apparatus 100 may be shifted by one opening to the left on the basis of the first openings OPN1 or the second openings OPN2 of the pattern guide PGP. However, the present disclosure is not limited thereto.

In addition, the target substrate SUB aligned with the ultra-fine pattern deposition apparatus 100 during primary pattern deposition is removed after primary pattern deposition. Then, the ultra-fine pattern deposition apparatus 100 performs a pattern deposition process such as alignment with the target substrate SUB newly introduced for secondary pattern deposition (target substrate change).

The ultra-fine pattern deposition apparatus 100 according to the fourth embodiment of the present disclosure has a structure in which the density of arrangement of the heating part HTP and the openings OPN1 and OPN2 can be increased and source parts SRC can be alternately used. Consequently, according to the fourth embodiment, a pattern can be deposited on two target substrates through one-time source pre-coating process, and thus source usage efficiency can be improved.

Fifth Embodiment

Figure 9:
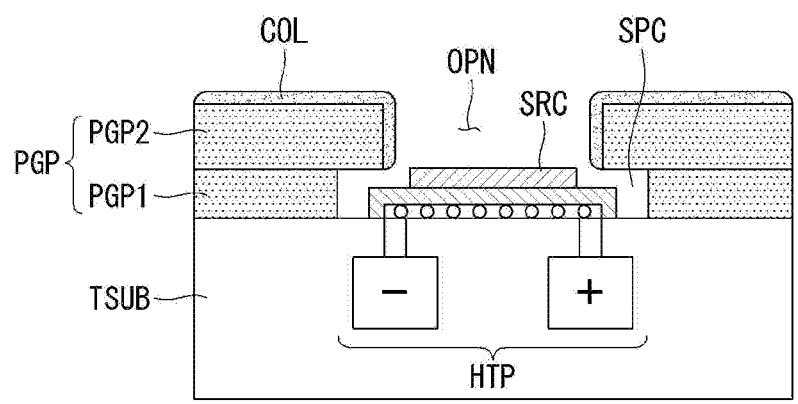
FIG. 9 is a first exemplary diagram illustrating a part of an ultra-fine pattern deposition apparatus according to a fifth embodiment of the present disclosure.
Figure 10:
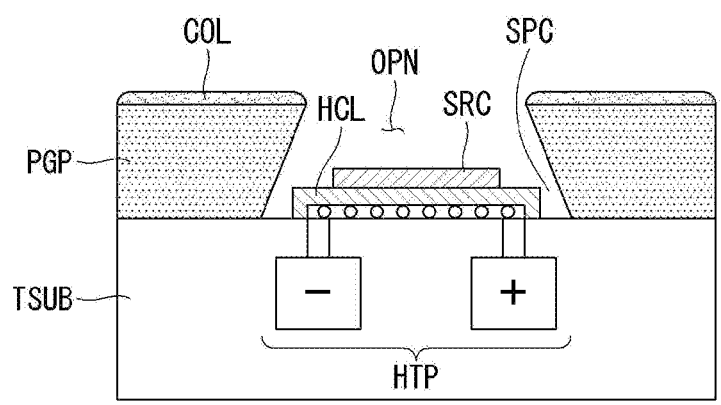
FIG. 10 is a second exemplary diagram illustrating the part of the ultra-fine pattern deposition apparatus according to the fifth embodiment of the present disclosure.

FIG. 9 is a first exemplary diagram illustrating a part of an ultra-fine pattern deposition apparatus according to a fifth embodiment of the present disclosure and FIG. 10 is a second exemplary diagram illustrating the part of the ultra-fine pattern deposition apparatus according to the fifth embodiment of the present disclosure.

As shown in FIG. 9, the pattern guide PGP may be formed of at least two layers corresponding to a supporting part PGP1 and a guide part PGP2 instead of being formed of a single layer. The supporting part PGP1 is positioned on one side (e.g., a front side) of the base substrate TSUB and supports the guide part PGP2. The guide part PGP2 is positioned on the supporting part PGP1 and guides the source emitted from the source part SRC to a target region.

The guide part PGP2 defines the opening OPN which exposes the source part SRC. To this end, the guide part PGP2 is further protruded in the lateral direction to have an area larger than the supporting part PGP1 in both the plan view and the cross-sectional view of the base substrate TSUB. That is, the guide part PGP2 extends laterally beyond side surfaces of the supporting part PGP1, which forms overhang regions where the guide part PGP2 is suspended over the base substrate TSUB. The supporting part PGP1 and the guide part PGP2 may be formed of the same material or different materials.

The supporting part PGP1 and the guide part PGP2 may be formed of a material which can be etched using an etching solution. When the supporting part PGP1 and the guide part PGP2 are formed, undercut processing using an etching solution may be used such that the supporting part PGP1 is laterally recessed from the guide part PGP2. When the undercut processing is used, the lower part of the opening OPN in contact with the base substrate TSUB is wider than the upper part thereof separated from the base substrate TSUB. Accordingly, the pattern guide PGP has an undercut structure formed through the undercut processing.

Furthermore, when the undercut processing is used, the supporting part PGP1 is partially removed and thus a space SPC can be formed under the guide part PGP2. Accordingly, the pattern guide PGP may have a T-shape (or mushroom shape). However, the shape of the pattern guide PGP is not limited to that shown in the figure. When the pattern guide PGP has the aforementioned shape, the coating layer COL formed thereon may be positioned to cover the surface and the side of the pattern guide PGP. That is, the coating layer COL may cover an upper surface of the pattern guide PGP (e.g., an upper surface of the guide part PGP2) and side surfaces of the pattern guide PGP in the openings OPN (e.g., side surfaces of the guide part PGP2).

As shown in FIG. 10, the pattern guide PGP may be formed of a single layer. In this case, the pattern guide PGP may also be formed of a material which can be etched using an etching solution. To form an opening OPN which becomes wider with decreasing distance to the base substrate TSUB, undercut processing using an etching solution may be used.

When the undercut processing is used, the lower part of the pattern guide PGP is removed more than the upper part thereof and thus a space SPC can be formed at the bottom of the pattern guide PGP. Accordingly, the opening OPN of the pattern guide PGP may have a reverse tapered shape. However, the shape of the opening OPN is not limited to that shown in the figure. When the pattern guide PGP has the aforementioned shape, the coating layer COL formed thereon may be positioned to cover only the surface (e.g., the upper surface) of the pattern guide PGP.

As can be known from the description with reference to FIGS. 9 and 10, the space SPC (e.g., an undercut region) which is not directly exposed to the outside is provided in the opening OPN of the pattern guide PGP. The space SPC is formed between the laterally recessed lower part of the opening OPN and the surface of the base substrate TSUB. The sidewall and the ceiling forming the space SPC (i.e., the sidewall and/or the ceiling of the portions of the pattern guide PGP in the undercut region which forms the space SPC) may have a straight, non-straight, diagonal, circular, oval or polygonal shape depending on characteristics of the material and an etch rate.

The space SPC provided between the opening OPN of the pattern guide PGP and the base substrate TSUB serves to store heat generated from the heater HP and to provide the stored heat to the source part SRC in order to aid in evaporation of the source part SRC. Further, the space SPC provided between the opening OPN of the pattern guide PGP and the base substrate TSUB serves to prevent the source evaporated from the source part SRC from reaching regions other than the opening OPN. Accordingly, the shape of the space SPC provided between the opening OPN of the pattern guide PGP and the base substrate TSUB can be optimized through repeated experiment in consideration of the aforementioned characteristics.

Sixth Embodiment

Figure 11A:
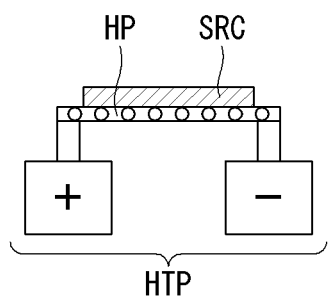
FIGS. 11A, 11B, and 11C are diagrams illustrating various configurations of a heating part included in an ultra-fine pattern deposition apparatus according to a sixth embodiment of the present disclosure.
Figure 11B:
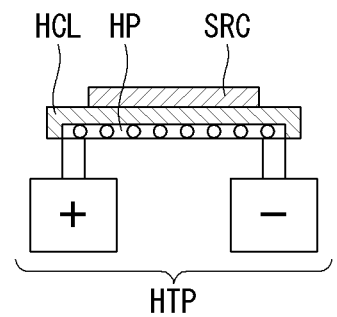
Figure 11C:
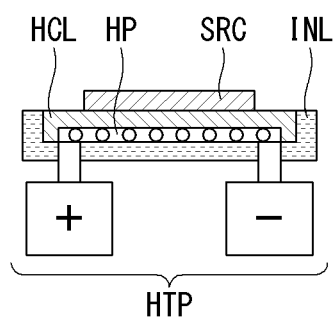
Figure 12A:
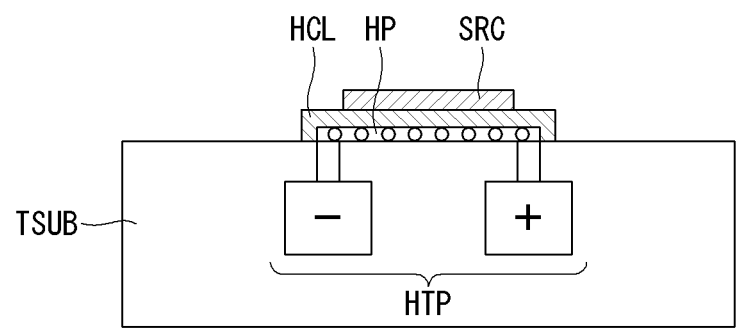
FIGS. 12A, 12B, and 12C are diagrams illustrating various examples of arrangement of the heating part included in the ultra-fine pattern deposition apparatus according to the sixth embodiment of the present disclosure.
Figure 12B:
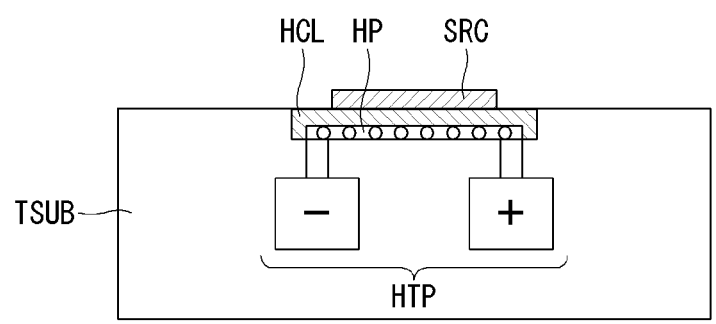
Figure 12C:
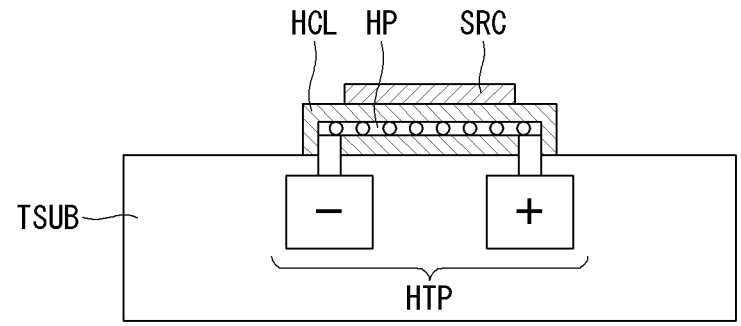
Figure 13A:
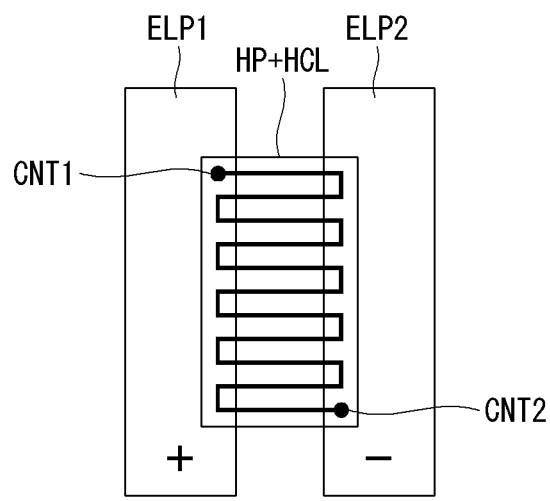
FIGS. 13A and 13B are plan views of various electrode structures of the heating part included in the ultra-fine pattern deposition apparatus according to the sixth embodiment of the present disclosure.
Figure 13B:
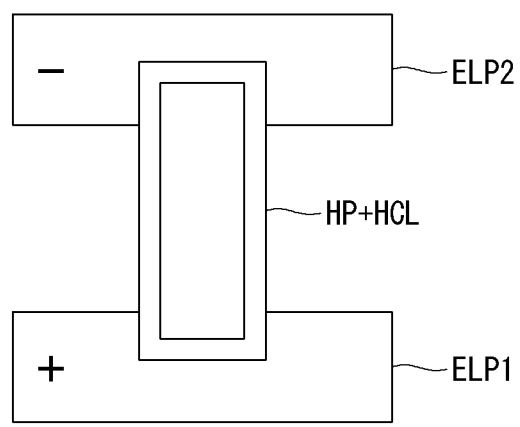
Figure 14A:
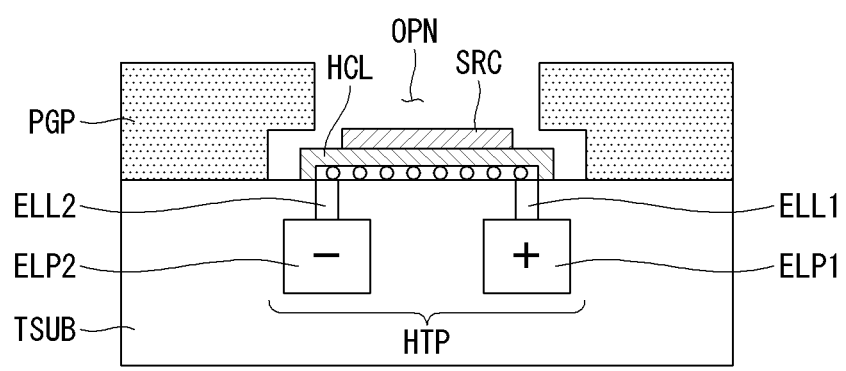
FIGS. 14A and 14B are cross sectional views of various electrode structures of the heating part included in the ultra-fine pattern deposition apparatus according to the sixth embodiment of the present disclosure
Figure 14B:
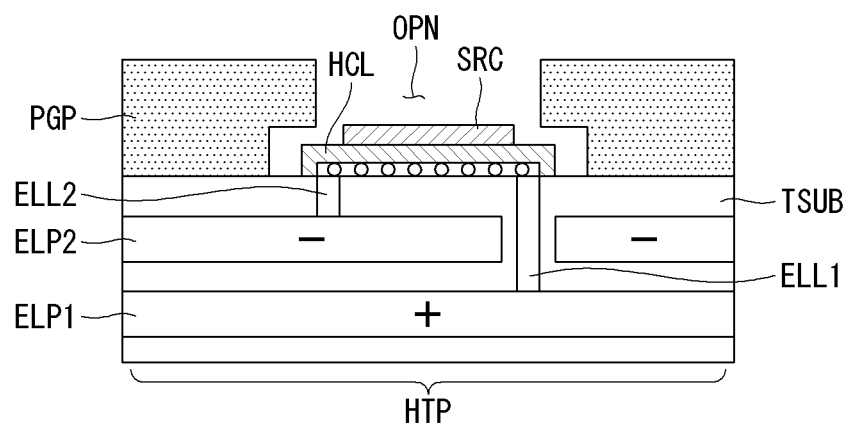

FIGS. 11A, 11B, and 11C are diagrams illustrating various configurations of a heating part included in an ultra-fine pattern deposition apparatus according to a sixth embodiment of the present disclosure, FIGS. 12A, 12B, and 12C are diagrams illustrating various examples of arrangement of the heating part included in the ultra-fine pattern deposition apparatus according to the sixth embodiment of the present disclosure, FIGS. 13A and 13B are plan views of various electrode structures of the heating part included in the ultra-fine pattern deposition apparatus according to the sixth embodiment of the present disclosure, and FIGS. 14A and 14B are cross-sectional views of various electrode structures of the heating part included in the ultra-fine pattern deposition apparatus according to the sixth embodiment of the present disclosure.

As shown in FIG. 11A, the heating part HTP may include only the heater HP as a component generating heat except the electrodes and electric lines. In this case, the source part SRC is disposed on the surface of the heater HP. In the structure shown in FIG. 11A, the heating part HTP can be simply configured, e.g., without including the thermal conductive layer HCL, to reduce the cost.

As shown in FIG. 11B, the heating part HTP may include the heater HP and the thermal conductive layer HCL as is a component generating heat except the electrodes and electric lines. In this case, the thermal conductive layer HCL is disposed on the heater HP and the source part SRC is disposed on the surface of the thermal conductive layer HCL. The structure shown in FIG. 11B can further improve the thermal conductivity of the heating part HTP.

As shown in FIG. 11C, the heating part HTP may include the heater HP, the thermal conductive layer HCL and an insulating layer INL as a component generating heat except the electrodes and electric lines. In this case, the thermal conductive layer HCL is disposed on the heater HP and the heater HP and the thermal conductive layer HCL are sealed by the insulating layer INL. The source part SRC is disposed on the surface of the thermal conductive layer HCL or the insulating layer INL. The structure shown in FIG. 11C can further improve the thermal conductivity of the heating part HTP and increase the life of the heating part.

As shown in FIG. 12A, the components of the heating part HTP, which generate and transfer heat, may be disposed on one side of the base substrate TSUB. For example, the heater HP may be disposed on one side (upper surface) of the base substrate TSUB and the thermal conductive layer HCP may be disposed on one side (upper surface) of the heater HP.

As shown in FIG. 12B, the components of the heating part HTP, which generate and transfer heat, may be disposed inside of the base substrate TSUB. For example, the heater HP and the thermal conductive layer HCP formed thereon may be disposed inside of the base substrate TSUB. The heater HP and the thermal conductive layer HCP may be formed, for example, within a recess that extends partially into the base substrate TSUB. It is desirable that the surface of the thermal conductive layer HCL be exposed from the base substrate TSUB for thermal conductivity improvement, but the present disclosure is not limited thereto.

As shown in FIG. 12C, the components of the heating part HTP, which generate and transfer heat, may be disposed one side of the base substrate TSUB and part of the electric line layers ELL1 and ELL2 may be protruded from or otherwise extend beyond the surface of the base substrate TSUB.

For example, the heater HP may be disposed on one side (upper surface) of the base substrate TSUB with the upper part and the lower part thereof being sealed by the thermal conductive layer HCL. Sealing by the thermal conductive layer HCL can improve protection from damage (when the thermal conductive layer is formed of a metal material) when cleaning is performed or the apparatus is used for a long time.

In addition, the heater HP may have various geometrical shapes in order to enhance heat generation or the thermal conductivity with respect to the thermal conductive layer HCL, but the present disclosure is not limited thereto.

For example, the heater HP may be realized in a zigzag, block (or square), line, spiral or circular shape in the plan view. Further, the heater HP may be realized in a depressed or protruded form or other forms in the cross-sectional view as may be desirable, for example, depending on application.

Additionally, the thermal conductive layer HCL may be formed of any material having high thermal conductivity, such as tungsten and stainless steel, but the present disclosure is not limited thereto.

Furthermore, the source part SRC may be formed having a size smaller than the area of the thermal conductive layer HCL, as shown in FIG. 12A, formed having a size corresponding to the area of the thermal conductive layer HCL, or formed having a size greater than the area of the thermal conductive layer HCL. That is, in any of the configurations shown in 12A to 12C, the source part SRC may be formed to have a size (e.g., a thickness and/or a width) that is greater than, less than, or substantially equal to the size of the thermal conductive layer HCL. Here, it is desirable to determine the size of the source part SRC in consideration of distinct characteristics of the pattern guide PGP (e.g., as may be determined from emission characteristic test data).

As shown in FIG. 13A, the first electrode layer ELP1 for applying the positive voltage (+) and the second electrode layer ELP2 for applying the negative voltage (−) may be separated from each other in the horizontal direction in the plan view.

The heater HP and the thermal conductive layer HCL may be arranged between the first and second electrode layers ELP1 and ELP2. One end of the heater HP may be connected to the first electrode layer ELP1 through a first contact hole CNT1 and the other end thereof may be connected to the second electrode layer ELP2 through a second contact hole CNT2. Although FIG. 13A shows that the heater HP has a zigzag form, the shape of the heater HP is not limited thereto.

As shown in FIG. 13B, the first electrode layer ELP1 for applying the positive voltage (+) and the second electrode layer ELP2 for applying the negative voltage (−) may be separated from each other in the vertical direction in the plan view.

The heater HP and the thermal conductive layer HCL may be arranged between the first and second electrode layers ELP1 and ELP2. The heater HP may be directly connected to the first and second electrode layers ELP1 and ELP2 without a medium such as a contact hole. Although FIG. 13B shows that the heater HP has a block shape, the shape of the heater HP is not limited thereto.

As shown in FIG. 14A, the first electrode layer ELP1 for applying the positive voltage (+) and the second electrode layer ELP2 for applying the negative voltage (−) may be arranged at the same level and separated from each other in the horizontal direction in the cross-sectional view.

This structure may be applied when external voltages are supplied to each point at which the first electrode layer ELP1 and the second electrode layer ELP2 are provided (e.g., in a method of individually supplying the voltages), but the present disclosure is not limited thereto. This structure may cause voltage drop because voltage supply is performed per point.

As shown in FIG. 14B, the first electrode layer ELP1 for applying the positive voltage (+) and the second electrode layer ELP2 for applying the negative voltage (−) may be separated from each other in the vertical direction and arranged at different levels in the cross-sectional view.

This structure may be applied when external voltages are supplied through a specific point separated from the first electrode layer ELP1 and the second electrode layer ELP2 (e.g., in a method of commonly supplying voltages), but the present disclosure is not limited thereto. This structure does not require additional electric lines for supplying voltages to every point because voltage supply is performed through the specific point.

In addition, voltages may be applied to the heater HP through various methods such as a serial supply method and a parallel supply method, and the heating part may be realized in various structures such that an efficient voltage supply method can be employed according to arrangement structure of the heater HP.

As described above, the present disclosure performs a deposition process using the ultra-fine pattern deposition apparatus which emits sources in a space thereunder and thus can emit and deposit sources in a stabilized state. In addition, emitted sources are deposited on only selected sub-pixel regions on the target substrate through the pattern guide.

Although the present disclosure has been described through various embodiments in order to clarify the components of the present disclosure, one or more of the components in the embodiments can be combined and thus two or more of the embodiments may be combined.

According to the above description, the present disclosure has the following advantages.

1. Realization of Ultra-Fine (Ultra-Fine Pitch) High-Luminance/High-Efficiency Display Device An ultra-fine RGB OLED type or RGBW OLED type display device can be realized, and thus optical efficiency and luminance can be improved, compared to conventional W OLED type and color filter type display devices. This will be described in detail below.

Ultra-fine (ultra-fine pitch) display devices having 3,000 ppi or more, used for augmented reality (AR), can be realized using a silicon wafer based OLED (OLEDoS) formed using an RGB organic emission pattern.

Fine (fine pitch) 1,500 ppi display devices used for virtual reality (VR) can be realized using an OLED formed using an RGB organic emission pattern.

UHD display devices for smartphones can be realized using a plastic based OLED (pOLED).

2. Simplification of Pixel Structure of Ultra-Fine (Ultra-Fine Pitch) Display Device/Simplification of Manufacturing Process A structure for removing lateral leakage current, such as a trench structure, can be eliminated, and thus a pixel structure and a display panel manufacturing process can be simplified.

Lateral leakage current is generated between pixels in tandem W OLED ultra-fine (ultra-fine pitch) display devices having 1,500 ppi or more. The lateral leakage current is generated through a charge generated layer (CGL) in most cases.

Since a hole transport layer (HTL) having different thicknesses for RGB pixels can be formed using an organic thin film pattern, a conventional complicated additional process for forming an anode having various thicknesses need not be used.

3. Realization of Large-Size RGB OLED Type Display Device

Since a substrate-based deposition source array can be used, mask sagging due to gravity, which is a fundamental issue of fine metal masking, can be solved and thus large-size RGB OLED type display devices can be realized.

Therefore, the present disclosure can overcome limitations in the conventional LITI and LIPS patterning methods and improve the accuracy and efficiency of ultra-fine pattern deposition. Furthermore, the present disclosure can solve a problem with respect to increase in a pattern dimension allowance due to mask shadowing, a problem with respect to accuracy reduction due to sagging of the center of a mask, and the like. In addition, the present disclosure can provide a manufacturing method which can easily manufacture a large-size display panel. Moreover, the present disclosure can enhance thermal conductivity and protect components from being damaged when the apparatus is used for a long time, improving the life of the apparatus.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A deposition apparatus, comprising:
a base substrate;
a heating part having at least a part thereof included in the base substrate;
a deposition source material disposed on the heating part;
a pattern guide overlying the base substrate and having a portion thereof above the heating part and the deposition source material, the pattern guide having an opening including a laterally recessed lower region having a first vertical side surface and a first horizontal overlying surface that extends laterally outward from the first vertical side surface, the first horizontal overlying surface facing an upper surface of the base substrate and an upper region, the opening extending from the upper surface of the base substrate to an upper surface of the pattern guide, the lower region of the opening being wider than the upper region of the opening, the opening of the pattern guide being configured to guide a material emitted from the deposition source material to a target region on a target substrate that is spaced apart from the base substrate; and
a coating layer disposed to cover upper and side portions of the pattern guide to prevent the deposition source material from being formed on the pattern guide,
wherein the heating part includes a heater, a thermal conductive layer disposed on the heater, and an insulating layer covering the heater and the thermal conductive layer, wherein at least one of the heater, the thermal conductive layer and the insulating layer is positioned on a surface of the base substrate or positioned at least partially inside of the base substrate, and wherein a maximum height between the upper surface of the base substrate and an upper surface of the deposition source material on the heating part is equal to a height of the first vertical side surface of the laterally recessed lower region.

2. The deposition apparatus according to claim 1, further comprising a cooler, which, in use, reduces heat transferred to the pattern guide or maintains the pattern guide at a temperature lower than a temperature of the heating part.

3. The deposition apparatus according to claim 2, wherein the cooler comprises a thermoelectric cooler.

4. The deposition apparatus according to claim 1, wherein the pattern guide is formed of a single layer of material.

5. The deposition apparatus according to claim 1, wherein the pattern guide is formed of at least two layers of materials.

6. The deposition apparatus according to claim 1, wherein the heater is configured to generate heat based on an applied voltage.

7. The deposition apparatus according to claim 6, wherein the heater is formed in at least one of zigzag, block, line, spiral and circular shapes.

8. The deposition apparatus according to claim 1, wherein the portion of the pattern guide above the heating part is non-overlapping with the deposition source material disposed on the heating part in a first direction, and wherein the heating part is disposed between the deposition material and the base substrate in the first direction.

9. A deposition method using a deposition apparatus of claim 1, the deposition method comprising:

depositing the material from the deposition source material on the target region of the target substrate by supplying a voltage to the heating part and emitting the material through the opening.

10. The deposition method according to claim 9, wherein the arranging the deposition apparatus to face the target substrate includes arranging the deposition apparatus under the target substrate.

11. The deposition method according to claim 9, wherein the depositing the material on the target region includes forming a pattern by depositing the material on respective emission regions of a plurality of sub-pixels.

12. The deposition method according to claim 11, wherein the pattern guide includes a plurality of first openings and a plurality of second openings, and the forming the pattern includes:

forming a primary pattern by depositing a first portion of the material on a first portion of the emission regions through the first openings; and forming a secondary pattern by depositing a second portion of the material on a second portion of the emission regions through the second openings.

13. The deposition method according to claim 12, wherein the deposition apparatus includes a plurality of heating parts and the forming the primary pattern includes depositing the first portion of the material by supplying heat from a first portion of the heating parts to a first portion of the deposition source material positioned in the first openings, and forming the secondary pattern includes:

aligning the second openings of the deposition apparatus with target regions of a second target substrate by arranging the deposition apparatus to face the second target substrate and shifting the deposition apparatus, and depositing the second portion of the material by supplying heat from a second portion of the heating parts to a second portion of the deposition source material positioned in the second openings.

* * * * *